(12) United States Patent
Sandhu et al.

(10) Patent No.: US 8,657,597 B2
(45) Date of Patent: Feb. 25, 2014

(54) TEMPLATES FOR USE IN IMPRINT LITHOGRAPHY AND RELATED INTERMEDIATE TEMPLATE STRUCTURES

(75) Inventors: Gurtej S. Sandhu, Boise, ID (US); William T. Rericha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 132 days.

(21) Appl. No.: 12/839,755

(22) Filed: Jul. 20, 2010

(65) Prior Publication Data

US 2010/0285167 A1  Nov. 11, 2010

Related U.S. Application Data

(62) Division of application No. 11/155,167, filed on Jun. 17, 2005, now Pat. No. 7,771,917.

(51) Int. Cl.
*A01J 21/00* (2006.01)

(52) U.S. Cl.
USPC .................. 425/385; 425/174.4; 264/293

(58) Field of Classification Search
USPC .................. 425/385, 174.4; 264/293
See application file for complete search history.

(56) References Cited

U.S. PATENT DOCUMENTS

| | | | |
|---|---|---|---|
| 5,643,251 A | 7/1997 | Hillsman et al. | |
| 5,817,242 A | 10/1998 | Biebuyck et al. | |
| 6,120,697 A | 9/2000 | Demmin et al. | |
| 6,133,641 A * | 10/2000 | Hamada et al. | 257/797 |
| 6,517,977 B2 | 2/2003 | Resnick et al. | |
| 6,580,172 B2 | 6/2003 | Mancini et al. | |
| 6,716,754 B2 | 4/2004 | Hofmann | |
| 6,759,180 B2 | 7/2004 | Lee | |
| 6,842,229 B2 | 1/2005 | Sreenivasan et al. | |
| 7,063,919 B2 * | 6/2006 | Mancini et al. | 430/5 |
| 2002/0098257 A1 * | 7/2002 | Ikeda et al. | 425/374 |

(Continued)

FOREIGN PATENT DOCUMENTS

JP  2007245702  9/2007
KR  1020080033676  4/2008

OTHER PUBLICATIONS

Written Opinion of the International Searching Authority for International Application No. PCT/US2009/038914, dated Oct. 29, 2009, four (4) pages.

(Continued)

*Primary Examiner* — Joseph S Del Sole
*Assistant Examiner* — David N Brown, II
(74) *Attorney, Agent, or Firm* — TraskBritt

(57) ABSTRACT

A method of forming a template for use in imprint lithography. The method comprises providing an ultraviolet ("UV") wavelength radiation transparent layer and forming a pattern in the UV transparent layer by photolithography. The pattern may be formed by anisotropically etching the UV transparent layer and may have feature dimensions of less than approximately 100 nm, such as dimensions of less than approximately 45 nm. An additional embodiment of the method comprises providing a UV opaque layer comprising a first pattern therein, forming a first UV transparent layer in contact with the first pattern of the UV opaque layer, forming a second UV transparent layer in contact with the first UV transparent layer, and removing the UV opaque layer to form the template. An intermediate template structure for use in imprint lithography is also disclosed. In other embodiments, a template that is opaque to UV wavelength radiation and a method of forming the same are disclosed.

7 Claims, 2 Drawing Sheets

(56) References Cited

U.S. PATENT DOCUMENTS

| | | |
|---|---|---|
| 2002/0122995 A1* | 9/2002 | Mancini et al. .................. 430/5 |
| 2003/0203319 A1 | 10/2003 | Lee |
| 2003/0205657 A1 | 11/2003 | Voisin |
| 2004/0008334 A1 | 1/2004 | Sreenivasan et al. |
| 2004/0021254 A1* | 2/2004 | Sreenivasan et al. ......... 264/406 |
| 2004/0023126 A1* | 2/2004 | Mancini et al. .................. 430/5 |
| 2005/0031998 A1 | 2/2005 | Chen et al. |
| 2005/0064344 A1 | 3/2005 | Bailey et al. |
| 2005/0067379 A1* | 3/2005 | Sreenivasan et al. ........... 216/44 |
| 2005/0230882 A1* | 10/2005 | Watts et al. .................... 264/496 |
| 2005/0236360 A1* | 10/2005 | Watts et al. ..................... 216/41 |
| 2006/0286490 A1 | 12/2006 | Sandhu et al. |
| 2008/0230947 A1 | 9/2008 | Chou et al. |
| 2009/0263729 A1 | 10/2009 | Sinha |

OTHER PUBLICATIONS

International Search Report for International Application No. PCT/US2009/038914, dated Oct. 29, 2009, three (3) pages.

* cited by examiner

TEMPLATES FOR USE IN IMPRINT LITHOGRAPHY AND RELATED INTERMEDIATE TEMPLATE STRUCTURES

CROSS-REFERENCE TO RELATED APPLICATIONS

This application is a divisional of U.S. patent application Ser. No. 11/155,167, filed Jun. 17, 2005, now U.S. Pat. No. 7,771,917, issued Aug. 10, 2010, the entire disclosure of which is hereby incorporated herein by this reference. This application is also related to U.S. patent application Ser. No. 12/106,732, filed Apr. 21, 2008, now abandoned.

FIELD OF THE INVENTION

The present invention relates to methods of fabricating templates for use in imprint lithography and related structures. More specifically, the present invention relates to fabricating such templates using photolithographic techniques.

BACKGROUND OF THE INVENTION

In the semiconductor industry, conventional patterning processes include patterning a photoresist layer by lithographic methods, such as photolithography, electron beam, or X-ray lithography, for mask definition. The pattern on the photoresist layer is subsequently transferred into a hard material in contact with the photoresist layer using a dry etch, wet etch, or lift-off technique. Photolithography is limited to forming features of approximately 90 nm with a 248 nm light, approximately 45 nm with a 193 nm light, and from approximately 25 nm to approximately 30 nm with a 13.7 nm (extreme ultraviolet ("EUV")) light. The limitations on the resolution of conventional photolithography are due to the wavelength of radiation used in the process. In addition, photolithographic equipment becomes increasingly expensive as feature sizes become smaller. In contrast, electron beam lithography is capable of creating smaller features, such as features in the tens of nanometers range. With electron beam lithography, the features are generated at an earlier point in time than with conventional lithography. However, electron beam lithography is expensive and very slow.

As feature sizes on semiconductor devices become smaller, imprint lithography has been proposed as a replacement for photolithography. In imprint lithography, a template having a nanoscale pattern is pressed into a film on the semiconductor device. The pattern on the template deforms the film and forms a corresponding image in the film. After removing the template, the pattern in the film has been transferred to the semiconductor device. The size of the pattern on the template and of the corresponding features on the semiconductor device are substantially similar. Therefore, unlike photolithographic techniques where a mask or reticle pattern is reduced substantially (for example, 4×) in size when transferred to the surface of a semiconductor device, imprint lithography is considered a "1×" pattern transfer process because it provides no demagnification of the pattern on the template that is transferred to the semiconductor device surface. Templates for use in imprint lithography are known in the art, as described in U.S. Pat. Nos. 6,580,172 to Mancini et al. and 6,517,977 to Resnick et al. the disclosures of each of which patents are incorporated herein by reference. To form the high-resolution pattern on the template, electron beam mask-making techniques are typically used. However, use of these techniques is undesirable because they are expensive and have low throughput.

As feature sizes on semiconductor devices approach sub-100 nm, there is a need for a fast, reliable, and cost effective method of making small features. Since imprint lithography is capable of forming small features, it would be desirable to more easily and cheaply produce templates for use in imprint lithography.

BRIEF SUMMARY OF THE INVENTION

The present invention, in one exemplary embodiment, relates to a method of forming a template for use in imprint lithography that comprises providing an ultraviolet ("UV") wavelength radiation transparent layer and forming a pattern in the UV wavelength radiation transparent layer by photolithography. The UV wavelength radiation transparent layer may comprise a UV wavelength radiation transparent material selected from the group consisting of quartz, magnesium fluoride, titanium oxide, calcium fluoride, silicon oxide, silicon dioxide, polycarbonate, a PYREX® material, sapphire, silicon germanium carbon, gallium nitride, silicon germanium, gallium arsenide, gate oxide, and mixtures and combinations thereof. The pattern may be formed in the UV wavelength radiation transparent layer by anisotropically etching the UV wavelength radiation transparent layer. The pattern may have at least some feature dimensions of less than approximately 100 nm, such as dimensions of less than approximately 45 nm.

The present invention, in another exemplary embodiment, also relates to a method of forming a template for use in imprint lithography that comprises providing a UV wavelength radiation opaque layer comprising a first pattern therein. The first pattern may be formed by photolithography. The UV wavelength radiation opaque layer may be a silicon wafer. A first UV wavelength radiation transparent layer is formed in contact with the first pattern of the UV wavelength radiation opaque layer. The first UV wavelength radiation transparent layer may conform to the surface topography of the first pattern on the UV wavelength radiation opaque layer, may be substantially planar on its opposing surface, and may be formed of one of the above-described UV wavelength radiation transparent materials by at least one of chemical vapor deposition, physical vapor deposition, atomic layer deposition, and spin-coating. The first UV wavelength radiation transparent layer may, for example, be silicon oxide. A second UV wavelength radiation transparent layer is formed or applied in contact with the first UV wavelength radiation transparent layer, where the second UV wavelength radiation transparent layer may also be formed from one of the UV wavelength radiation transparent materials described above. The UV wavelength radiation opaque layer is then removed, such as by etching the UV wavelength radiation opaque layer without etching the first and second UV wavelength radiation transparent layers, exposing a pattern conforming to the topography of, but reversed from, that of the first pattern.

The present invention, in a further exemplary embodiment, also relates to an intermediate template structure for use in imprint lithography. The intermediate template structure comprises an UV wavelength radiation opaque layer comprising a first pattern therein, a first UV wavelength radiation transparent layer in contact with the UV wavelength radiation opaque layer, and a second UV wavelength radiation transparent layer in contact with the first UV wavelength radiation transparent layer. The UV wavelength radiation opaque layer may be a silicon wafer. The first UV wavelength radiation transparent layer may be substantially planar and may include a second pattern that is a negative image of the first pattern. The first UV wavelength radiation transparent layer may be formed of one of the above-described UV wavelength radiation transparent materials and may, for example, be silicon oxide. The second UV wavelength radiation transparent layer may also be formed from one of the UV wavelength radiation transparent materials described above. The first pattern may have feature dimensions of less than approximately 100 nm, such as less than approximately 45 nm.

The present invention, in another exemplary embodiment, relates to a template structure for use in imprint lithography. The template comprises a first ultraviolet wavelength radiation transparent layer in contact with a second ultraviolet wavelength radiation transparent layer. At least one of the first ultraviolet wavelength radiation transparent layer and the second ultraviolet wavelength radiation transparent layer comprises topography on a surface thereof.

The present invention, in another exemplary embodiment, relates to a method of forming a template for use in imprint lithography that comprises providing an ultraviolet wavelength radiation opaque layer and forming a pattern in the ultraviolet wavelength radiation opaque layer by photolithography. The ultraviolet wavelength radiation opaque layer may include a material selected from the group consisting of silicon, a ceramic, a metal material, and mixtures and combinations thereof.

The present invention, in a further exemplary embodiment, relates to a template for use in imprint lithography that comprises an ultraviolet wavelength radiation opaque layer comprising topography on a surface thereof.

The present invention, in another exemplary embodiment, relates to an intermediate template structure for use in imprint lithography that comprises a transparent layer and an opaque layer comprising a pattern therein. The transparent layer is in conformal contact with the pattern of the opaque layer and the opaque layer is formulated to be selectively etchable relative to the transparent layer.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

A template for use in imprint lithography is disclosed. The template includes a high-resolution pattern that may be formed by lithography. The pattern on the template provides topography that is used to imprint a pattern of corresponding features on a semiconductor device. In other words, the template functions as a mold or form to transfer the pattern to the semiconductor device, forming the features on a surface thereof contacted by the template. As described in more detail below, the template may be transparent to UV wavelength radiation or may be opaque to UV wavelength radiation. The features on the semiconductor device may have dimensions substantially similar to dimensions of the pattern on the template. The features may have a feature size or dimension of less than approximately 100 nm, such as less than approximately 45 nm. By using photolithographic techniques to form the pattern, the template may be easily and cheaply fabricated. In addition, new infrastructure and processing equipment may not need to be developed because existing photolithographic infrastructure and processing equipment may be used to fabricate the template.

Figure 1:
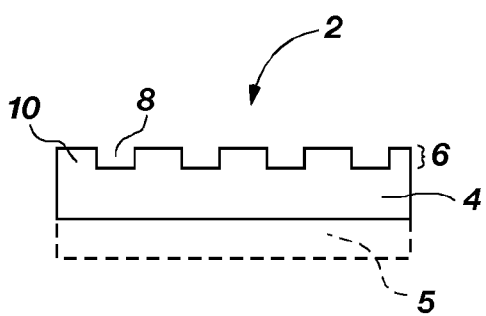
FIG. 1 is a cross-sectional view of a template used in imprint lithography, which is fabricated in accordance with the present invention.

In one embodiment, template 2 may include a UV wavelength radiation transparent (which may also be termed "UV transparent" for convenience) layer 4 that has a pattern 6 on its top surface, as shown in FIG. 1. The UV transparent layer 4 may be formed from a UV transparent material including, but not limited to, quartz, magnesium fluoride, titanium oxide, calcium fluoride, silicon oxide, silicon dioxide, a polycarbonate material, a PYREX® material, a sapphire material, silicon germanium carbon, gallium nitride, silicon germanium, gallium arsenide, gate oxide, or mixtures or combinations thereof. The template 2 may be formed from the UV transparent material to allow UV radiation to be transmitted through the template 2. For the sake of example only, the UV transparent layer 4 may be formed from quartz, such as in the form of a quartz wafer. While embodiments herein describe that the UV transparent layer 4 is a quartz layer, other UV transparent materials may also be used. The UV transparent layer 4 may have substantially the same dimensions (diameter, thickness, etc.) as a conventional semiconductor wafer (silicon wafer) so that processing equipment currently used in photolithography techniques may be used to fabricate the template 2 and so that the template 2 may be used to imprint a pattern on the entire surface of a semiconductor wafer simultaneously. However, if the UV transparent layer 4 has smaller or larger dimensions, the processing equipment may be modified, as desired, to accommodate the UV transparent layer 4. The pattern 6, which may also be termed an "imprint pattern" for the sake of convenience, may include a topography having a plurality of recesses 8 and protrusions 10 of satisfactory size, configuration, and orientation in one surface of the UV transparent layer 4. The recesses 8 and protrusions 10 in the template 2 are ultimately used to produce substantially identical features on semiconductor devices fabricated on a wafer or other bulk semiconductor substrate contacted by the template 2.

Figure 2:
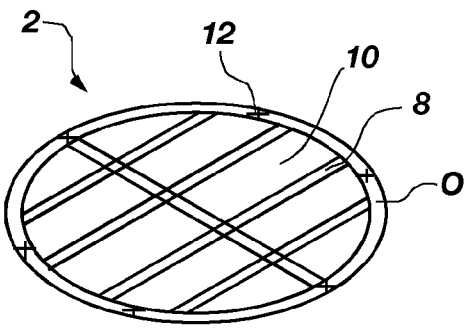
FIG. 2 is an elevational view of a template used in imprint lithography, which is fabricated in accordance with the present invention.

Since the template 2 is transparent to UV radiation, an optically opaque material O may be deposited on the UV transparent layer 4 to form alignment marks 12, as shown in FIG. 2. The optically opaque material O may be chromium or chrome, polysilicon, a metal silicide, such as molybdenum silicide, tungsten silicide, or titanium silicide, or a metal, such as aluminum, tungsten, titanium, titanium nitride, tantalum, or tantalum nitride. The optically opaque material O may be deposited by conventional blanket deposition techniques, such as by coating or sputtering techniques. The optically opaque material O may be deposited on portions of the UV transparent layer 4, such as scribe areas or the periphery, where the alignment marks 12 are desired, the rest of the UV transparent layer 4 being masked to prevent such deposition. Alternatively, as described below, all of template 2 may be covered by opaque material O. To provide proper alignment of the pattern 6 on the UV transparent layer 4, the alignment marks 12 may be formed on the UV transparent layer 4 before forming the pattern 6. The alignment marks 12 may also be used to align the template 2 with the semiconductor devices, which would typically include semiconductor devices on an unsingulated wafer, onto which the features corresponding to pattern 6 are to be formed.

Figure 3:
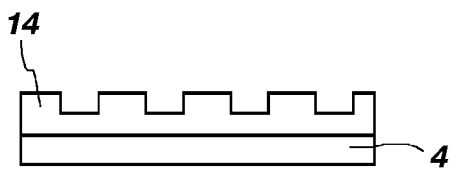
FIG. 3 schematically illustrates one embodiment of fabricating the template.

To form the pattern 6 in the UV transparent layer 4 and alignment marks 12 in optically opaque material O, photolithographic techniques may be used. For instance, a photoresist layer 14 may be formed and patterned on the UV transparent layer 4 using a mask (not shown) having opaque and transparent openings in the desired pattern, as shown in FIG. 3. The photoresist layer 14 may be formed from a conventional positive or negative photoresist material and may be deposited by conventional techniques, such as by spin-coating. The opaque and transparent openings in the mask form a pattern that is complementary to the pattern 6 that is ultimately to be formed on the template 2. The mask may be fabricated by conventional techniques as known in the art and, therefore, is not described in detail herein. The mask may include, for example, a 4× pattern in that the pattern is four times the size of the pattern 6 formed on the template 2 and four times the size of the features ultimately formed on the semiconductor device. The photoresist layer 14 may be exposed and developed, as known in the art, exposing selected portions of the UV transparent layer 4 to electromagnetic radiation. Exposure and development of the photoresist layer 14 may be performed using conventional exposure equipment and developing solutions. Developing solutions for the photoresist layer 14 may be selected by one of ordinary skill in the art and, therefore, are not discussed in detail herein. In addition to conventional photolithography, electron beam projection, electron beam direct write, ion direct write, or maskless lithography may be used to form the pattern 6 on the template 2. The pattern in the photoresist layer 14 may be then transferred to the UV transparent layer 4 and the alignment marks 12 formed in the opaque material O by etching, producing the template 2 shown in FIG. 1. Two separate, selective etches may also be used, one for opaque material O and one for UV transparent layer 4. Depending on the material used, the UV transparent layer 4 may be etched isotropically (wet etched) or anisotropically (dry etched). Wet and dry etching solutions for the UV transparent materials described above are known in the art and, therefore, are not discussed in detail herein. To provide superior resolution to the features of pattern 6, the UV transparent layer 4 may desirably be anisotropically etched. For the sake of example only, if the UV transparent layer 4 is a quartz wafer, the quartz may be etched using a fluorine-based plasma etch. The fluorine-based plasma may include a fluorine-containing gas, such as $CF_4$, $CHF_3$, $C_4F_8$, $SF_6$, or mixtures thereof, and an inert gas, such as argon, xenon, or mixtures thereof.

Figure 4:
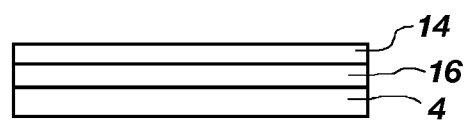
FIGS. 4 and 5 schematically illustrate another embodiment of fabricating the template.
Figure 5:
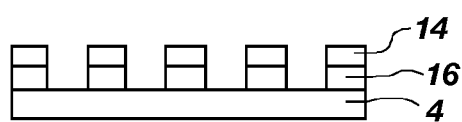

Alternatively, the UV transparent layer 4 may be patterned as illustrated in FIGS. 4 and 5 to produce the template 2. A chromium layer 16, used as optically opaque material O, may be blanket deposited over the UV transparent layer 4 and the photoresist layer 14 deposited over the chromium layer 16, as shown in FIG. 4. The chromium layer 16 may be deposited by conventional techniques and may range in thickness from approximately 80 nm to approximately 100 nm. While layer 16 is described as being formed from chromium, layer 16 may be formed from other metal materials that are opaque to the imaging wavelength and have significant etch selectivity relative to the UV transparent layer 4 including, but not limited to, chromium oxide, titanium, titanium nitride, tungsten, or mixtures thereof. The photoresist layer 14 may be a conventional photoresist material and may be deposited by conventional techniques, such as spin-coating. The photoresist layer 14 may be patterned as described above, to expose portions of the chromium layer 16. As shown in FIG. 5, the pattern in the photoresist layer 14 may be transferred to the chromium layer 16 and, subsequently, to the UV transparent layer 4, by etching. For instance, the exposed portions of the chromium layer 16 may be etched, using the photoresist layer 14 as a mask. The remaining portions of the chromium layer 16 may function as a hard mask for etching the UV transparent layer 4 and to provide alignment marks 12. Each of the chromium layer 16 and the UV transparent layer 4 may be etched using a suitable, conventional wet or dry etch process. The etching solutions may be selected by one of ordinary skill in the art and, therefore, are not discussed in detail herein. As previously discussed, to form features having a high-resolution on a semiconductor substrate, which may be a wafer bearing a plurality of semiconductor device locations thereon, the UV transparent layer 4 may be etched anisotropically, such as by using the fluorine-based plasma etch described above. Any portions of the photoresist layer 14 and undesired portions of the chromium layer 16 remaining on the UV transparent layer 4 after etching may be removed as desired, producing the pattern 6 and alignment marks 12 on the template 2, as shown in FIGS. 1 and 2.

In order to utilize existing processing equipment, the thickness of the UV transparent layer 4 may be insufficient to provide adequate mechanical strength during handling and use of the template 2 when it is used in imprint lithography. Therefore, the template 2 may optionally be bonded to a second UV transparent material substrate 5 as shown in broken lines in FIG. 1 to provide additional mechanical integrity. The second UV transparent material substrate 5 may be one or more of the materials described above for use as the UV transparent layer 4. The template 2 and the second UV transparent material substrate 5 may be adhered with an adhesive composition that does not affect the UV transparency of the template 2. In other words, the template 2 and the second UV transparent material substrate 5, when bonded, may remain UV transparent. It would also be desirable, for alignment and pattern resolution purposes, for the template 2, including second UV transparent material substrate 5 and any bonding materials, to exhibit a substantially uniform index of refraction through the thickness thereof.

The template 2 shown in FIGS. 1 and 2 may be used directly in an imprint lithographic technique to imprint the pattern 6 on a semiconductor wafer or other bulk semiconductor substrate of like size bearing a plurality of semiconductor devices, forming corresponding features on the semiconductor devices. The features to be foil led on the semiconductor devices may be a negative image (reversed image) of the pattern 6 on the template 2. Alternatively, the template 2 may be divided, such as by dicing, to form smaller templates that are used in imprint lithography or smaller groups of semiconductor devices. The pattern 6 on each of the smaller templates may be the same or different. The template 2 on each of the divided templates may be bonded to the optional second UV transparent material substrate 5 before or after dicing.

To form the desired features on the semiconductor devices by imprint lithography, the template 2 having the pattern 6 may be brought into contact with the semiconductor devices. A complete process flow for fabricating the semiconductor devices is not described herein. However, the remainder of the process flow is known to a person of ordinary skill in the art. Accordingly, only the process steps necessary to understand the present invention are described herein. As shown in FIG.

Figure 6:
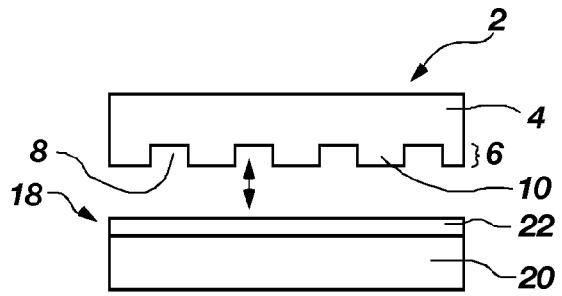
FIGS. 6-8 schematically illustrate using the template in an imprint lithography process to form features on a semiconductor device.

6, semiconductor device 18 may include a bare substrate 20 and additional layers thereon, such as metal layers, oxide layers, carbon hard mask layers, or polysilicon layers. The semiconductor device 18 may also include trenches or diffusion regions. For the sake of clarity, the additional layers, trenches, and diffusion regions are not shown in FIG. 6. The bare substrate 20 may be a conventional substrate or other bulk substrate having a layer of semiconductor material. As used herein, the term "bulk substrate" includes not only silicon wafers, but also silicon-on-insulator ("SOI") substrates, silicon-on-sapphire ("SOS") substrates, epitaxial layers of silicon on a base semiconductor foundation, and other semiconductor, optoelectronics, or biotechnology materials, such as silicon-germanium, germanium, gallium arsenide, or indium phosphide.

The semiconductor device 18 may also include a transfer layer 22 that is deformable under pressure and does not adhere to a surface of the template 2, especially as the template 2 is removed from the semiconductor device 18. Since the transfer layer 22 is deformable, the transfer layer 22 may fill the recesses 8 in the pattern 6 when the template 2 and the semiconductor device 18 come into contact. The transfer layer 22 may be a radiation sensitive material including, but not limited to, a photocurable or photosensitive material, such as a photoresist material. The transfer layer 22 may be sensitive to UV light, visible light, infrared light, actinic light, or other radiation sources, such as electron beams or X-rays. Materials that may be used as the transfer layer 22 are known in the art. For the sake of example only, the transfer layer 22 may be formed from a conventional photoresist material that is curable by exposure to UV light, such as a curable organo-silicon material.

Figure 7:
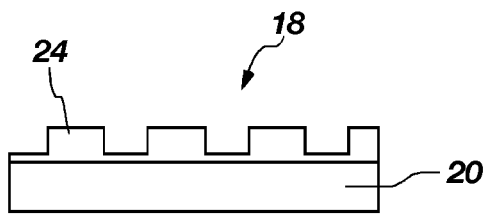

The semiconductor device 18 and the template 2 may be maintained substantially parallel, and in close proximity, to one another. The semiconductor device 18 and the template 2 may then be contacted with minimal pressure so that the transfer layer 22 deforms into the pattern 6 of the template 2. As shown in FIG. 7, the semiconductor device 18 may thus be provided with a negative image 24 (reversed image) of the pattern 6 in its imprinted transfer layer 22. If the transfer layer 22 is a radiation-sensitive material, the transfer layer 22 may subsequently be exposed to radiation, such as UV radiation. Since the template 2 is UV transparent, the UV radiation is transmitted through the template 2 from the back, unpatterned surface thereof to harden portions of the negative image 24 of transfer layer 22 that include photoresist material filling recesses 8 of pattern 6 or to harden all of the negative image 24 of transfer layer 22 that includes photoresist material filling recesses 8 and protrusions 10 of pattern 6. Alternatively, if the transfer layer 22 includes a material that is sensitive to heat, pressure, or combinations thereof, which are generated by contacting the template 2 with the semiconductor device 18, the heat, pressure, or combinations thereof may be used to cure, harden, or solidify the transfer layer 22. The template 2 may then be removed from the semiconductor device 18. The template 2 and the semiconductor device 18 may be separated without damaging, or otherwise adversely affecting, the negative image 24. For instance, the template 2 may be treated with a material that lowers the surface energy of the template 2, as known in the art, to assist in separating the template 2 from the semiconductor wafer or other bulk substrate 18 without damage to the imprinted, exposed negative image 24.

Figure 8:
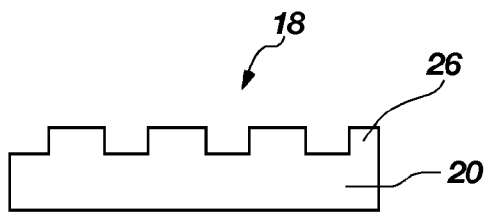

The negative image 24 in the transfer layer 22 may be transferred to the substrate 20 or underlying layers of the semiconductor device 18 using the transfer layer 22 as a mask. For instance, the negative image 24 may be transferred into the substrate 20 or into the metal, carbon, hard mask layer, oxide, or polysilicon layers previously formed on the substrate 20 by dry etching or wet etching. Any remaining portions of the transfer layer 22 may then be removed, providing the features 26 on the semiconductor device 18 as shown in FIG. 8. The features 26 may be substantially the same size, configuration, and orientation as the dimensions of the pattern 6 on the template 2 (see FIG. 1). Since the pattern 6 is formed by photolithography, the feature sizes may be determined by the resolution of the photolithographic techniques used to form the pattern 6. In one embodiment, the features 26 have a feature size of less than approximately 100 nm, such as less than approximately 45 nm. Alternatively, the negative image 24 in the transfer layer 22 may be subjected to ion implantation to form implanted regions on the semiconductor device.

In addition to forming features on the semiconductor devices, the template 2 may be used as a master template to create at least one daughter template. To form the daughter template, the pattern 6 on the template 2 may be transferred to an additional structure, which includes a UV transparent material and a transfer layer, such as a photoresist layer. The UV transparent material and transfer layer of the structure that is ultimately to become the daughter template may be one of the materials described above. The transfer layer may be deformable under pressure so that when the template 2 contacts the transfer layer of the structure that is ultimately to be the daughter template, the pattern 6 of the master template is transferred to the transfer layer. The pattern in the transfer layer may subsequently be etched into the UV transparent material, producing the daughter template. The pattern on each of the daughter templates may be the reverse of the pattern 6 on the master template. In other words, the pattern 6 on the master template may be a negative image of the pattern on the daughter template.

Since the template 2 contacts the semiconductor device 18 during imprint lithography, the template 2 may become easily damaged. Therefore, the master template may be stored and preserved while one of the daughter templates fabricated from it is used to imprint the features on the semiconductor devices. If the daughter template is damaged during imprinting, another daughter template may be used to imprint the features or the master template may be used to create additional daughter templates.

Figure 9:
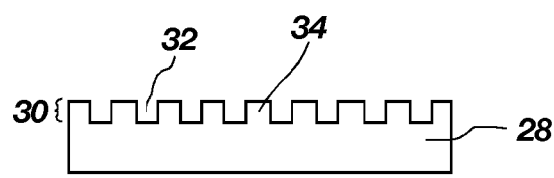
FIGS. 9-12 schematically illustrate another embodiment of fabricating the template.

In another embodiment, the template 2' may include more than one UV transparent layer (see FIG. 12), where at least one of the UV transparent layers has a pattern on an exposed surface thereof. The template 2' may be formed using a layer of material that is opaque to UV radiation, which is removed before using the template 2' in imprint lithography. The UV wavelength radiation opaque (also termed merely "UV opaque" for the sake of convenience) layer 28 may be formed from silicon, such as a silicon wafer, ceramic, or a metal material. As shown in FIG. 9, the UV opaque layer 28 may be etched to include a first pattern 30, which is a negative image of a second pattern 40 (see FIG. 12) that is ultimately formed on the surface of template 2'. The first pattern 30 may include recesses 32 and protrusions 34. The UV opaque layer 28 may be patterned using conventional photolithographic techniques. To form the first pattern 30, a mask (not shown) having opaque and transparent portions may be used. The opaque and transparent portions form a pattern in the mask, which is used to produce the first pattern 30 on a photoresist layer covering the UV opaque layer 28. The mask may be fabricated by conventional techniques and may be used in patterning the UV opaque layer 28 as previously discussed. The photoresist on UV opaque layer 28 may be developed and the UV opaque layer 28 may be etched using conventional developing solutions and etch solutions or dry etch chemistries. Alignment marks (not shown) may also be patterned and etched into the UV opaque layer 28 by conventional techniques.

Figure 10:
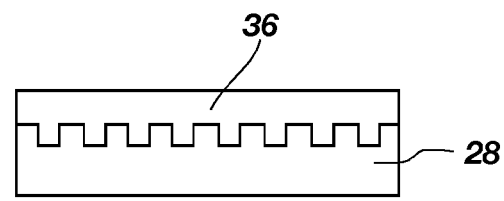

As illustrated in FIG. 10, a UV transparent material may be deposited over the UV opaque layer 28, filling in the recesses 32 of the first pattern 30 and forming a first UV transparent layer 36. In one embodiment, the UV transparent material is silicon dioxide. However, other UV transparent materials may also be used, such as those described earlier. The upper surface of the first UV transparent layer 36 is substantially planar. First UV transparent layer 36 may be deposited using a highly conformal deposition technique including, but not limited to, chemical vapor deposition ("CVD"), physical vapor deposition ("PVD"), atomic layer deposition ("ALD"), spin-coating, or combinations thereof. The UV transparent material is deposited conformally so that the recesses 32 in the first pattern 30 may be filled without forming voids between the first UV transparent layer 36 and the topography of UV opaque layer 28. If the UV opaque layer 28 includes a large recess, the first UV transparent layer 36 may be formed by filling this recess with the UV transparent material using a combination of ALD to conform to the topography of opaque layer 28, followed by spin-coating.

Figure 11:
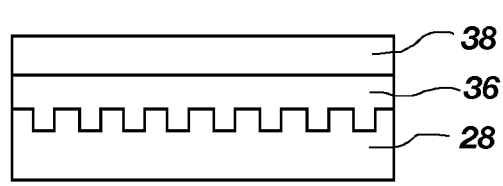

The first UV transparent layer 36 may be bonded to a second UV transparent layer 38, as shown in FIG. 11, sandwiching the first UV transparent layer 36 between the UV opaque layer 28 and the second UV transparent layer 38. The second UV transparent layer 38 may be one of the UV transparent materials described earlier. For the sake of example only, the second UV transparent layer 38 may be a quartz wafer. Since the surface of the first UV transparent layer 36 not in contact with UV opaque layer 28 is substantially planar, good adhesion may be obtained between the first UV transparent layer 36 and the second UV transparent layer 38. The two UV transparent layers 36, 38 may be bonded using an adhesive composition that does not affect the UV transparency of either of these layers. Such adhesive compositions are known in the art and may be selected by one of ordinary skill in the art. As with the previous embodiment, it is desirable that a substantially uniform index of refraction be maintained throughout the thickness of template 2'. The template 2' may be used in SOI wafer bonding techniques.

Figure 12:
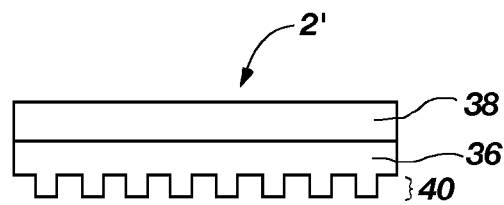

The UV opaque layer 28 may be removed from the first UV transparent layer 36, forming a template 2' that includes the first and second UV transparent layers 36, 38. The template 2' is as shown in FIG. 12 and includes the second pattern 40 in the first UV transparent layer 36. The UV opaque layer 28 may be removed using conventional wet or dry etch techniques selective for the UV opaque layer 28 relative to the first and second UV transparent layers 36, 38. As such, the first UV transparent layer 36 and the second UV transparent layer 38 may remain substantially undamaged after removing the UV opaque layer 28. In one embodiment, the UV opaque layer 28 is etched using a conventional wet etch, which is inexpensive and rapid. Portions of UV opaque layer 28 may be left unetched (as by selective masking) to define alignment marks 12 (see FIG. 2).

The second pattern 40 on the template 2' may be transferred to a semiconductor device by imprint lithography, forming features on the semiconductor device. The features may be a negative image (reversed image) of the second pattern 40, which is itself a negative image of the first pattern 30 formed in the UV opaque layer 28. The semiconductor device may be imprinted with the template 2', substantially as described above in regard to FIGS. 6-8, except that template 2' is used instead of template 2.

In another embodiment, the template may include a UV opaque layer having a pattern on its top surface. The techniques described above may be used to form the UV opaque template, except that a UV opaque material is used instead of a UV transparent material. As such, the UV opaque template of this embodiment is substantially as shown in FIG. 1, except that the UV opaque template includes a UV opaque material. The UV opaque material may be silicon, a ceramic, or a metal material. The UV opaque material may be etched to include the pattern, which is a negative image of the pattern that is ultimately formed on the semiconductor device 18. As previously described, the pattern may include recesses and protrusions, which are formed using conventional photolithographic techniques. The recesses and protrusions in the UV opaque template are ultimately used to produce substantially identical features on the semiconductor device 18. Alignment marks (not shown) may also be patterned and etched into the UV opaque material by conventional techniques. The UV opaque template may optionally be bonded to a second UV opaque material substrate, as previously described, to provide additional mechanical integrity.

After forming the UV opaque template, the UV opaque template may be brought into contact with the transfer layer 22 of the semiconductor device 18. Upon contact, the transfer layer 22 may fill the recesses in the pattern on the UV opaque template, transferring a negative image 24 (reversed image) of the pattern to the transfer layer 22 of the semiconductor device 18. In this embodiment, the transfer layer 22 may be a material that is cured or hardened by heat, pressure, or combinations thereof. Such materials are known in the art and, therefore, are not described in detail herein. The heat, pressure, or combinations thereof used to cure, harden, or solidify the transfer layer 22 may be generated upon contact between the UV opaque template and the semiconductor device 18. The UV opaque template may then be removed from the semiconductor device 18, as previously described, without damaging, or otherwise adversely affecting, the negative image 24.

As previously described, the negative image 24 in the transfer layer 22 may be transferred to the substrate 20 or underlying layers of the semiconductor device 18 using the transfer layer 22 as a mask. For instance, the negative image 24 may be transferred into the substrate 20 or into the metal, carbon, hard mask layer, oxide, or polysilicon layers previously formed on the substrate 20 by dry etching or wet etching. Any remaining portions of the transfer layer 22 may then be removed, providing the features 26 on the semiconductor device 18. The features 26 may be substantially the same size, configuration, and orientation as the dimensions of the pattern on the UV opaque template. Since the pattern is formed by photolithography, the feature sizes may be determined by the resolution of the photolithographic techniques used to form the pattern. In one embodiment, the features 26 have a feature size of less than approximately 100 nm, such as less than approximately 45 nm. Alternatively, the negative image 24 in the transfer layer 22 may be subjected to ion implantation to form implanted regions on the semiconductor device.

The UV transparent or UV opaque templates produced by the methods of the present invention provide numerous advantages. In forming the semiconductor device 18, if imprint lithography is used at some process levels and conventional photolithography is used at other process levels, lens distortion and magnification factor effects are typically observed in the semiconductor device 18. However, the UV transparent or UV opaque templates formed by the methods of the present invention may be used to provide improved matching between the imprint lithography process levels and the conventional photolithography process levels. For instance, if the same photostepper used in the process levels formed by conventional photolithography is also used to form the UV transparent template or the UV opaque template, the lens distortion and magnification factor effects at the different process levels in the semiconductor device 18 may be minimized. The method of the present invention may also provide the UV transparent template or the UV opaque template at a reduced cost compared to conventional techniques.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A template for use in imprint lithography, comprising:
a first ultraviolet wavelength radiation transparent material having a planar surface opposing a patterned surface comprising a plurality of recesses and a plurality of protrusions;
a second ultraviolet wavelength radiation transparent material in contact with the planar surface of the first ultraviolet radiation transparent material;
an adhesive composition bonding the first ultraviolet wavelength radiation transparent material to the second ultraviolet wavelength radiation transparent material, the adhesive composition having an index of refraction substantially similar to that of each of the first ultraviolet wavelength radiation transparent material and the second ultraviolet wavelength radiation transparent material; and
an optically opaque material in contact with one of a periphery of the first ultraviolet wavelength radiation transparent material and scribe areas of the first ultraviolet wavelength radiation transparent material.

2. The template of claim 1, wherein the first ultraviolet wavelength radiation transparent material comprises a plurality of protrusions, each protrusion of the plurality of protrusions having a feature dimension of less than about 100 nm.

3. The template for use in imprint lithography of claim 1, wherein the optically opaque material is located only on the periphery of the first ultraviolet wavelength radiation transparent material.

4. The template for use in imprint lithography of claim 1, wherein the optically opaque material is located only on the scribe areas of the first ultraviolet wavelength radiation transparent material.

5. The template for use in imprint lithography of claim 1, further comprising at least one alignment mark within the optically opaque material.

6. The template for use in imprint lithography of claim 1, wherein the optically opaque material extends continuously along the periphery of the first ultraviolet wavelength radiation transparent material.

7. The template for use in imprint lithography of claim 1, further comprising at least one alignment mark on the first ultraviolet wavelength radiation transparent material.

\* \* \* \* \*